(12) United States Patent
Heo et al.

(10) Patent No.: US 9,997,487 B2
(45) Date of Patent: Jun. 12, 2018

(54) DISPLAY DEVICE WITH IMPROVED ANISOTROPIC CONDUCTIVE FILM

(71) Applicant: Samsung Display Co., Ltd., Yongin-si, Gyeonggi-do (KR)

(72) Inventors: Kyeong Yeol Heo, Yongin-si (KR); Joon Sam Kim, Yongin-si (KR); Ji Hoon Kim, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/424,636

(22) Filed: Feb. 3, 2017

(65) Prior Publication Data

US 2017/0271293 A1 Sep. 21, 2017

(30) Foreign Application Priority Data

Mar. 15, 2016 (KR) .................. 10-2016-0030908

(51) Int. Cl.
*H01L 23/00* (2006.01)
*H05K 1/11* (2006.01)
(Continued)

(52) U.S. Cl.
CPC .............. *H01L 24/29* (2013.01); *H01L 24/32* (2013.01); *H01L 27/124* (2013.01); *H05K 1/111* (2013.01);
(Continued)

(58) Field of Classification Search
CPC ........... G09G 3/344; G09G 2300/0452; G09G 1/1362; G09G 2001/1676; H05K 3/34; H05K 3/32; H05K 3/36; H01B 5/14; H01R 4/04; C09J 7/02; C09J 9/02; C09J 7/0239; C09J 7/0264; C09J 2205/30; C09J 2205/20; C09J 2203/318; C09J 2201/603; C08K 7/16
(Continued)

(56) References Cited

U.S. PATENT DOCUMENTS 7,948,592 B2 * 5/2011 Do ...................... G02F 1/13363
349/117
8,102,494 B2 * 1/2012 Nishida .................. G02B 1/118
349/137
(Continued)

FOREIGN PATENT DOCUMENTS

JP 2015-149451 8/2015
KR 10-2007-0104742 10/2007
(Continued)

*Primary Examiner* — Alexander Oscar Williams
(74) *Attorney, Agent, or Firm* — Knobbe Martens Olson & Bear LLP (57) ABSTRACT

A display device includes: a first substrate; a wire portion disposed on the first substrate; a pad portion connected with the wire portion; a printed circuit board facing the first substrate and including an output electrode; and an anisotropic conductive film disposed between the first substrate and the printed circuit board, wherein the anisotropic conductive film comprises a plurality of conductive particles disposed with a constant gap, and the plurality of conductive particles respectively disposed at apexes of virtual regular hexagons in a plan view, with a longest diagonal of the respective virtual regular hexagon being parallel with the y-axis.

19 Claims, 10 Drawing Sheets

(51) Int. Cl.
  *H01L 27/12*   (2006.01)
  *G02F 1/1345*  (2006.01)
  *G02F 1/1362*  (2006.01)
  *H01L 27/32*   (2006.01)

(52) U.S. Cl.
  CPC .... *G02F 1/13452* (2013.01); *G02F 1/136286* (2013.01); *H01L 27/3276* (2013.01); *H01L 2224/29499* (2013.01); *H01L 2224/32227* (2013.01); *H05K 2201/10136* (2013.01)

(58) Field of Classification Search
  USPC ........................................................ 257/746
  See application file for complete search history.

(56) References Cited

U.S. PATENT DOCUMENTS

| | | | | |
|---|---|---|---|---|
| 8,947,411 | B2* | 2/2015 | Beon | G06F 3/0412 |
| | | | | 345/207 |
| 9,064,708 | B2* | 6/2015 | Kwack | H01L 24/06 |
| 9,224,360 | B2* | 12/2015 | Heo | G09G 5/006 |
| 2008/0129933 | A1* | 6/2008 | Nishida | G02B 1/118 |
| | | | | 349/96 |
| 2008/0130122 | A1* | 6/2008 | Egi | G02B 1/118 |
| | | | | 359/613 |
| 2011/0248909 | A1* | 10/2011 | Sato | G09G 3/344 |
| | | | | 345/107 |
| 2014/0141195 | A1 | 5/2014 | Liang et al. | |

FOREIGN PATENT DOCUMENTS

| KR | 10-2011-0037792 | 4/2011 |
|---|---|---|
| KR | 10-2012-0126770 | 11/2012 |
| KR | 10-2015-0087191 | 7/2015 |

\* cited by examiner

DISPLAY DEVICE WITH IMPROVED ANISOTROPIC CONDUCTIVE FILM

RELATED APPLICATIONS

This application claims priority to, and the benefit of, Korean Patent Application No. 10-2016-0030908 filed in the Korean Intellectual Property Office on Mar. 15, 2016, the entire contents of which are incorporated herein by reference.

BACKGROUND

Field

The described technology relates generally to a display device.

Description of the Related Technology

As a display displaying a screen, a display device includes a liquid crystal display (LCD), an organic light emitting diode (OLED) display, and the like. Recently, a bendable or foldable flexible display has been developed for improving portability or satisfaction of a viewer.

The display device includes a substrate, a plurality of signal lines formed on the substrate, and a thin film transistor. In addition, a printed circuit board that generates various signals for driving the display device may be arranged in a predetermined area of the substrate. A pad portion connected with an end of the signal line is disposed in the substrate. In order to electrically connect the pad portion and an output electrode of the printed circuit board, an anisotropic conductive film (ACF) having conductivity only in a thickness direction may be used. The anisotropic conductive film is disposed between the substrate and an integrated circuit board.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide a display device that can prevent occurrence of a short-circuit between conductive particles of an anisotropic conductive film and prevent electric disconnection between a pad portion and a printed circuit board.

A display device according to one embodiment includes: a first substrate; a wire portion disposed on the first substrate; a pad portion connected with the wire portion; a printed circuit board facing the first substrate and including an output electrode; and an anisotropic conductive film disposed between the first substrate and the printed circuit board, wherein the anisotropic conductive film comprises a plurality of conductive particles disposed with a constant gap, and the plurality of conductive particles respectively disposed at apexes of virtual regular hexagons in a plan view, with a longest diagonal of the respective virtual regular hexagon being parallel with the y-axis.

The pad portion may include a data pad, and the data pad may be formed as a parallelogram of which the height may be greater than the bottom side, the bottom side may be parallel with the x-axis perpendicular to the y-axis, and the height may be parallel with the y-axis.

The wire portion may include a data line extending along the y-axis, and the data pad may be connected with an end of the data line.

The data pad may be inclined obliquely with respect to the y-axis.

The pad portion may include a plurality of data pads, and the plurality of data pads may be inclined in two different directions.

The two directions may be symmetrical to each other with respect to the y-axis.

The pad portion may include a plurality of data pads, the plurality of data pads may be arranged in a matrix along the y-axis and the x-axis perpendicular to the y-axis, and a gap between the plurality of data pads adjacent to each other in the y-axis may be greater than a gap between the plurality of data pads adjacent to each other in the x-axis.

The output electrode may include a first output electrode electrically connected with the data pad, the first output electrode may be formed of a parallelogram of which the height is greater than the bottom side, the bottom side of the parallelogram may be parallel with the x-axis perpendicular to the y-axis, and the height of the parallelogram may be parallel with the y-axis.

The first output electrode may be inclined obliquely with respect to the y-axis direction.

The output electrode may include a plurality of first output electrodes, and the plurality of first output electrodes may be inclined in two different directions.

The two directions may be symmetrical to each other with respect to the y-axis.

The pad portion and the output electrode may overlap each other, and may be electrically connected with each other through the plurality of conductive particles.

The pad portion and the output electrode may have the same shape in a plan view.

The printed circuit board may be formed as a rectangle of which two sides are parallel with the y-axis, and two sides may be parallel with the x-axis perpendicular to the y-axis.

The printed circuit board may be disposed at one edge of the first substrate.

The first substrate may be formed of a rectangle of which two sides are parallel with the y-axis, and two sides parallel with the x-axis perpendicular to the y-axis.

The pad portion may include a gate pad, the wire portion may include a gate line extending in the x-axis perpendicular to the y-axis, and the gate pad may be connected with an end of the gate line.

The output electrode may include a second output electrode electrically connected with the gate pad.

The printed circuit board may further include an input electrode receiving an external signal.

The display device may include a flexible display device.

The display device in various embodiments can prevent occurrence of a short-circuit between conductive particles of an anisotropic conductive film and prevent electric disconnection between a pad portion and a printed circuit board.

DETAILED DESCRIPTION OF CERTAIN INVENTIVE EMBODIMENTS

The present invention will be described more fully hereinafter with reference to the accompanying drawings, in which certain embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification.

In addition, the size and thickness of each configuration shown in the drawings are arbitrarily shown for better understanding and ease of description, but the present invention is not limited thereto.

In the drawings, the thickness of layers, films, panels, regions, etc., may be exaggerated for clarity. In the drawings, for better understanding and ease of description, the thickness of some layers and areas may be exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, the word "on" means positioning on or below the object portion, but does not essentially mean positioning on the upper side of the object portion based on a gravitational direction.

In addition, in this specification, the phrase "in a plane view" means viewing a target portion from the top, and the phrase "in a cross-section" means viewing a cross-section by vertically cutting a target portion from the side.

An anisotropic conductive film includes a plurality of conductive particles, and short-circuits may occur between particles if the conductive particles are disposed close to each other. On the contrary, when the plurality of conductive particles are disposed far away from each other, electric connection may not be established between the pad portion and the printed circuit board.

In particular, in case of a flexible display device, a flexible substrate such as a polyimide is coated to a rigid panel such as glass, an element is disposed on the flexible substrate, and then separation with the rigid panel and a cutting process are performed, and through such processes, the flexible substrate may be deformed. In this case, due to deformation of the substrate, short-circuits between the conductive particles and the electric disconnection between the pad portion and the printed circuit board may be more severe.

First, referring to FIG. 1, a display device according to an embodiment will be described.

Figure 1:
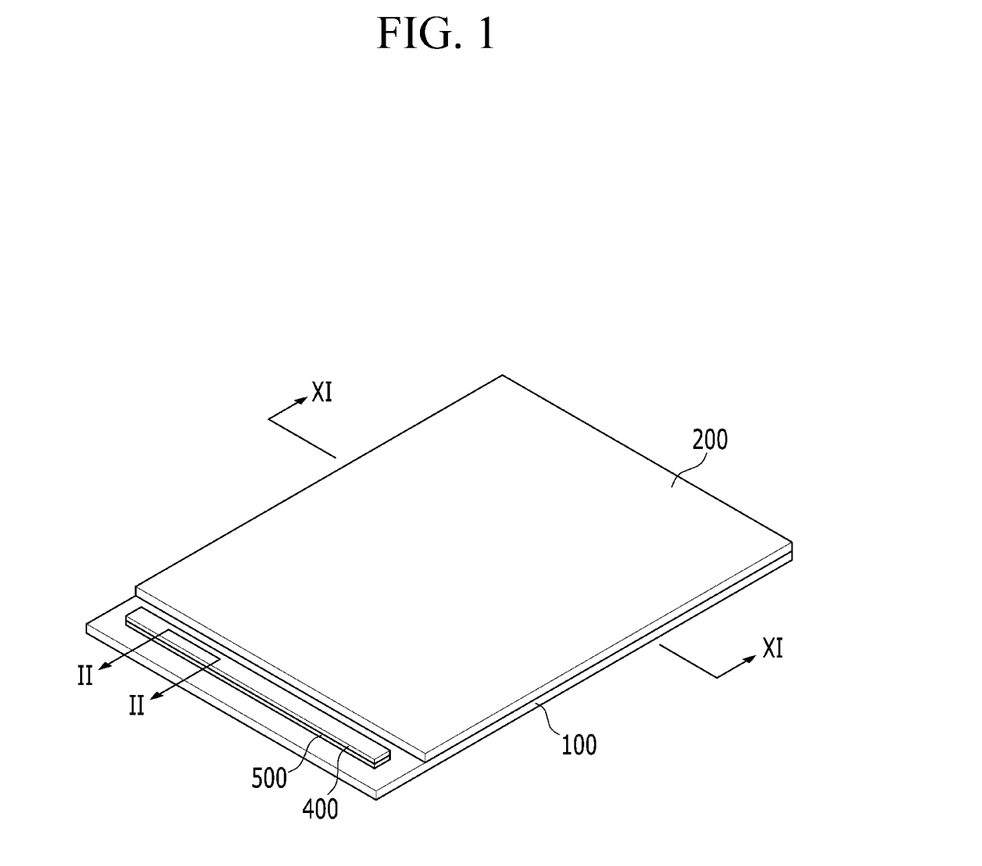
FIG. 1 is a perspective view of a display device according to an embodiment.

FIG. 1 is a perspective view of a display device according to an embodiment.

As shown in FIG. 1, a display device according to an embodiment includes a wire substrate 100, an encapsulation substrate 200, a printed circuit board 400, and an anisotropic conductive film 500. The encapsulation substrate 200 and the printed circuit board 400 are disposed facing the wire substrate 100, and the anisotropic conductive film 500 is disposed between the wire substrate 100 and the flexible printed circuit board 400.

The encapsulation substrate 200 covers a part of the wire substrate 100, and the flexible printed circuit board 400 covers the other part of the wire substrate 100. The wire substrate 100 may include a display area where a screen is displayed, and a peripheral area transmitting a predetermined signal to the display area. The display area occupies the greatest area of the wire substrate 100, and the peripheral area is disposed at one edge of the display area. However, the present invention is not limited thereto, and locations of the display area and the peripheral area may be variously modified. In FIG. 1, the peripheral area is disposed in a lower edge of the display area, but the peripheral area may be disposed in a lower edge or the left edge of the display area. In this case, the peripheral area may have a shape of an "L".

The encapsulation substrate 200 covers the display area of the wire substrate 100, and the flexible printed circuit board 400 covers the peripheral area of the wire substrate 100. Since the encapsulation substrate 200 and the flexible printed circuit board 400 respectively cover different portions, they do not overlap each other. The encapsulation substrate 200 is smaller than the wire substrate 100 in size, and the flexible printed circuit board 400 is also smaller than the wire substrate 100 in size.

The flexible printed circuit board 400 may be disposed in one edge of the wire substrate 100. The wire substrate 100 may be formed in the shape of a quadrangle, and the printed circuit board 400 may be disposed adjacent to one side of the quadrangular.

The anisotropic conductive film 500 electrically and physically connects the wire substrate 100 and the flexible printed circuit board 400. The anisotropic conductive film 500 is an adhesive film used for circuit connection, and when the adhesive film has anisotropy, one direction has electrical conductivity but the other direction is insulated. The anisotropic conductive film 500 includes an adhesive cured by heat, and minute conductive particles disposed therein. When the anisotropic conductive film 500 is pressed in a high temperature state, conductive balls contact the wire substrate 100 and the flexible printed circuit board 400 such that the wire substrate 100 and the flexible printed circuit board 400 become electrically connected. In addition, when the adhesive is cured, the wire substrate 100 and the flexible printed circuit board 400 are physically connected.

Next, the peripheral area of the display device according to an embodiment will be described with reference to FIG. 2 to FIG. 5.

Figure 2:
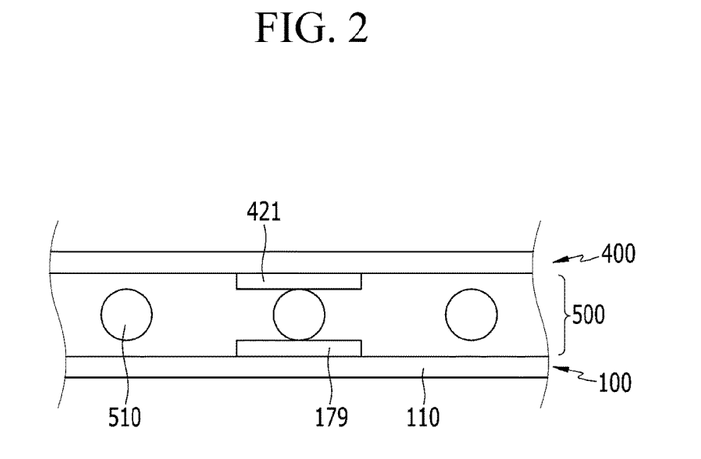
FIG. 2 is a cross-sectional view of the display device of FIG. 1, taken along the line II-II.
Figure 3:
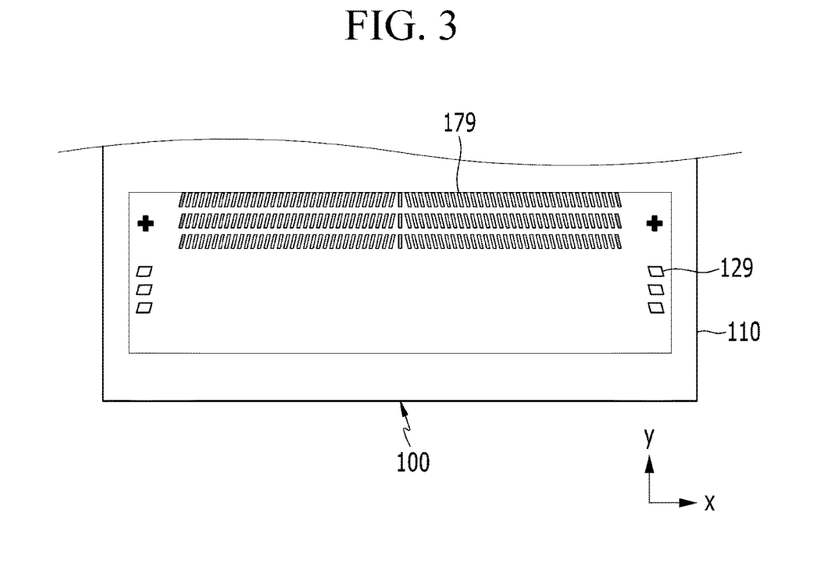
FIG. 3 is a top plan view of a wire substrate of the display device according to an embodiment.
Figure 4:
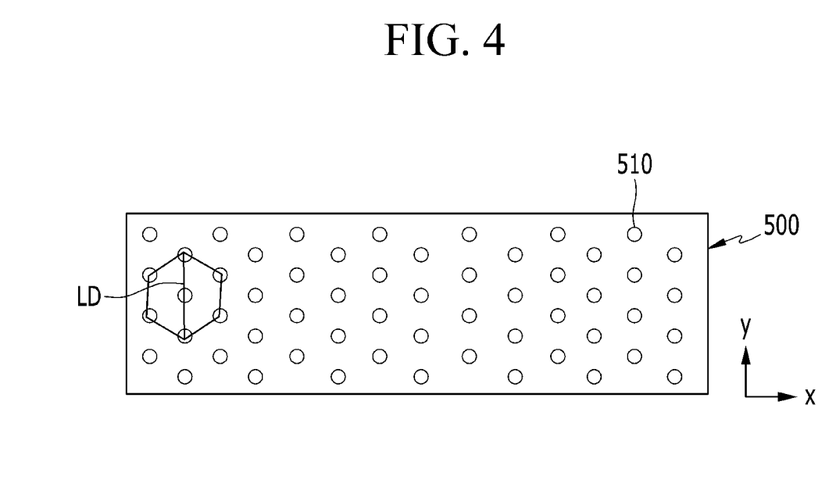
FIG. 4 is a top plan view of an anisotropic conductive film of the display device according to an embodiment.
Figure 5:
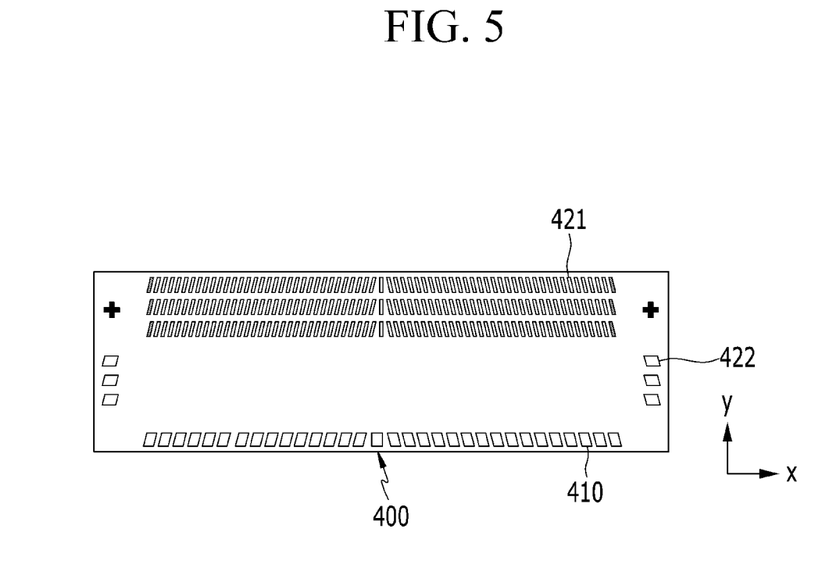
FIG. 5 is a top plan view of a printed circuit board of the display device according to an embodiment.

FIG. 2 is a cross-sectional view of the display device of FIG. 1, taken along the line II-II. FIG. 3 is a top plan view of the wire substrate of the display device according to an embodiment, FIG. 4 is a top plan view of the anisotropic conductive film of the display device according to an embodiment, and FIG. 5 is a top plan view of the printed circuit board of the display device according to an embodiment.

As shown in FIG. 2 and FIG. 3, the wire substrate 100 includes a first substrate 110, and pad portions 129 and 179 provided on the first substrate 110.

The first substrate 110 includes a flexible material that can be bent or folded.

The first substrate 110 may have a rectangular shape including two sides that are parallel with the x-axis and two sides that are parallel with the y-axis. The x-axis and the y-axis respectively present directions that are perpendicular to each other. FIG. 3 illustrates a part of the edge of the wire substrate 100. The entire shape of the first substrate 110 may be rectangular including two long sides that are parallel with the x-axis and two short sides that are parallel with the y-axis.

The pad portions 129 and 179 include a gate pad 129 and a data pad 179. A wire portion is disposed in the display area of the wire substrate 100, and the pad portions 129 and 179 are connected with an end of the wire portion. The pad portions 129 and 179 may include a metallic material having high conductivity. In order to improve contact performance of the pad portions 129 and 179, a contact assistance member may include a transparent conductive material such as, for example, indium tin oxide (ITO), indium zinc oxide (IZO), or the like.

The data pad 179 may be formed as a parallelogram, and the bottom side of the parallelogram is parallel with the x-axis while the height of the parallelogram is parallel with the y-axis. The height of the data pad 179 is formed of a parallelogram of which the height thereof is greater than the bottom side thereof. That is, the data pad 179 is long in the y-axis direction.

The data pad 179 is obliquely inclined with respect to the y-axis. The wire substrate 100 includes a plurality of data pads 179, and the plurality of data pads 179 may be inclined along two or more directions. As shown in FIG. 3, the data pad 179 located in a center extends in a direction that is parallel with the y-axis, the data pad 179 in the left side is inclined to the right side with respect to the y-axis, and the data pad 179 in the right side is inclined to the left side with respect to the y-axis. In this case, the data pads 179 in the left side and the right side are symmetrical to each other with reference to the data pad 179 in the center. However, the present invention is not limited thereto, and the slope of the data pad 179 may be variously modified. For example, all the data pads 179 may extend in a direction that is parallel with the y-axis.

The plurality of data pads 179 may be arranged in a matrix format. As shown in FIG. 3, the plurality of data pads 179 may be arranged in the matrix format along the x-axis and the y-axis. In this case, a gap between data pads 179 adjacent to each other in the y-axis is greater than a gap between data pads 179 adjacent to each other in the x-axis.

When the wire substrate 100 and the flexible printed circuit board 400 undergo a compression process, the wire substrate 100 or the printed circuit board 400 is aligned while being moved along the y-axis direction. In this case, misalignment may occur, but in order to maintain electric connection between the wire substrate 100 and the flexible printed circuit board 400, the data pad 179 may extend in the y-axis direction. In addition, when the misalignment occurs, a gap between data pads 179 that are adjacent to each other in the y-axis direction may be designed to be greater than a gap between data pads 179 that are adjacent to each other in x-axis direction so as to prevent the adjacent data pads 179 from being electrically connected.

As shown in FIG. 2 and FIG. 4, an anisotropic conductive film 500 is disposed between the wire substrate 100 and the flexible printed circuit board 400, and the anisotropic conductive film 500 includes a plurality of conductive particles 510.

The plurality of conductive particles 510 are disposed with a constant gap. The plurality of conductive particles 510 are disposed at respective apexes of a virtual regular hexagon in a plan view. In FIG. 4, the conductive particle 510 located in the center of the regular hexagon is also located in an apex of another virtual regular hexagon. In this case, distances between the conductive particles 510 located in the center of each regular hexagon and the conductive particles 510 located in the respective apexes of each regular hexagon are equal to each other. Further, distances between the conductive particles 510 located in the respective apexes are equal to each other. Thus, gaps between the plurality of conductive particles 510 that are adjacent to each other in any direction are equal to each other.

In addition, the longest diagonal LD of a virtual regular hexagon, which is an alignment reference of the plurality of conductive particles 510, is parallel with the y-axis. There are nine regular hexagon diagonals, wherein three of the nine are longest diagonals and one of the three longest diagonals is parallel with the y-axis. In FIG. 4, only one virtual regular hexagon is illustrated, but substantially, a plurality of conductive particles 510 are arranged with reference to a plurality of virtual hexagons that overlap each other.

As shown in FIG. 2 and FIG. 5, the flexible printed circuit board 400 may have a rectangular shape including two sides that are parallel with the x-axis and two sides that are parallel with the y-axis. In this case, the rectangle may be formed of two long sides that are parallel with the x-axis and two short sides that are parallel with the y-axis.

The flexible printed circuit board 400 includes an input electrode 410 and output electrodes 421 and 422.

The input electrode 410 receives an external signal. The input electrode 410 generates a predetermined gate signal, which is a data signal, and the like, by receiving the external signal, and outputs the generated signals to the output electrodes 421 and 422.

The output electrodes 421 and 422 include a first output electrode 421 and a second output electrode 422.

The first output electrode 421 overlaps the data pad 179, and the first output electrode 421 and the data pad 179 are electrically connected with each other through conductive particles 510 disposed therebetween. Thus, the data signal output from the first output electrode 421 is transmitted to the data pad 179 through the conductive particle 510.

The first output electrode 421 substantially has the same shape as the data pad 179 in a plan view. The first output electrode 421 may be formed of a parallelogram, and the bottom side of the parallelogram is parallel with the x-axis while the height thereof is parallel with the y-axis. That is, the height of the first output electrode 421 is greater than the bottom side of the first output electrode 421. That is, the first output electrode 421 is long in the y-axis direction.

The first output electrode 421 is obliquely inclined with respect to the y-axis. The flexible printed circuit board 400 includes a plurality of first output electrodes 421, and the plurality of first output electrodes 421 may be inclined in two or more directions. As shown in FIG. 5, the first output electrodes 421 located in the center of the printed circuit board 400 extend in a direction that is parallel with the y-axis, the first output electrodes 421 located in the left side are inclined to the right side with respect to the y-axis, and the first output electrodes 421 located in the right side are inclined to the left side with respect to the y-axis. In this case, the first output electrodes 421 located in the left side and the right side are respectively symmetrical to each other with reference to the first output electrodes 421 located in the center. However, the present invention is not limited thereto, and slopes of the first output electrodes 421 may be variously modified. For example, all the first output electrodes 421 may extend along a direction that is parallel with the y-axis.

The plurality of first output electrodes 421 may be disposed in a matrix format. As shown in FIG. 5, the plurality of first output electrodes 421 may be arranged in a matrix format along the x-axis and the y-axis. In this case, gaps between the plurality of first output electrodes 421 that are adjacent to each other along the y-axis are greater than gaps between the plurality of first output electrodes 421 that are adjacent to each other along the x-axis.

The second output electrodes 422 overlap the gate pad 129, and the second output electrodes 422 and the gate pad 129 are electrically connected with each other through the conductive particles 510 disposed therebetween. Thus, a gate signal output from the second output electrode 422 is transmitted to the gate pad 129 through the conductive particles 510.

The second output electrode 422 substantially has the same shape as the gate pad 129 in a plan view.

That is, the pad portions 129 and 179 of the wire substrate 100 and the output electrodes 421 and 422 of the printed circuit board 400 overlap each other, and they respectively have the same shape in a plan view. The pad portions 129 and 179 and the output electrodes 421 and 422 are electrically connected through the conductive particles 510 of the anisotropic conductive film 500.

Next, referring to FIG. 6 to FIG. 10, the anisotropic conductive film of the display device according to an embodiment and an anisotropic conductive film according to a reference example will be compared.

Figure 6:
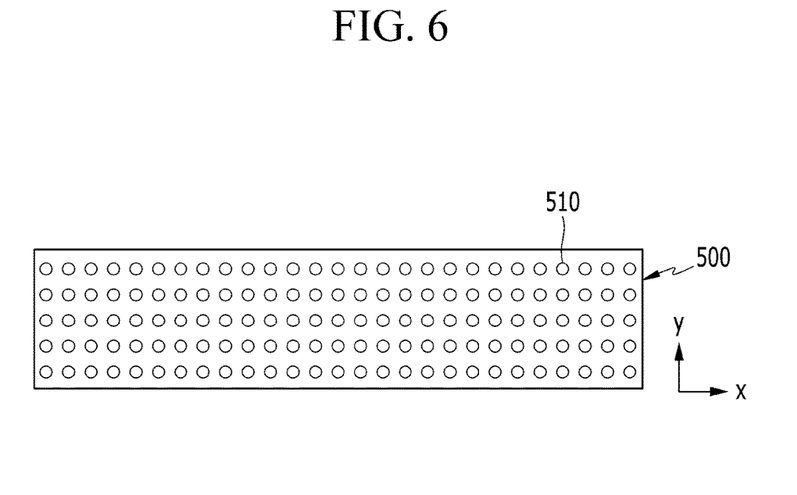
FIG. 6 is a top plan view of an anisotropic conductive film according to Reference Example 1.
Figure 7:
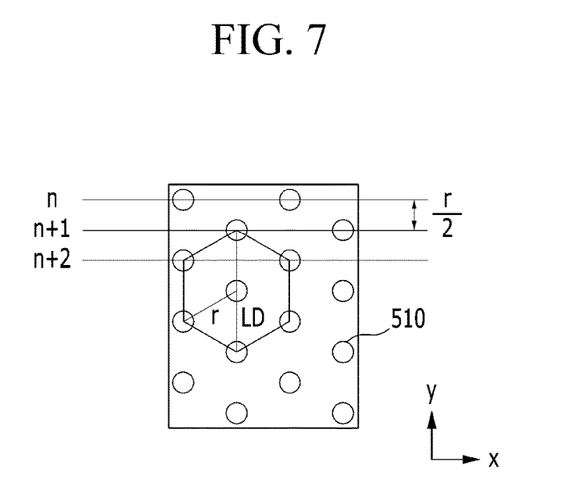
FIG. 7 is a top plan view of an anisotropic conductive film of a display device according to an embodiment.
Figure 8:
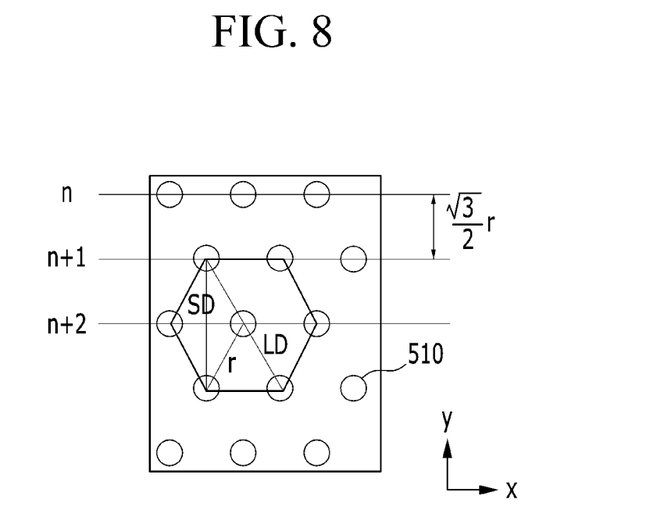
FIG. 8 is a top plan view of an anisotropic conductive film according to Reference Example 2.
Figure 9:
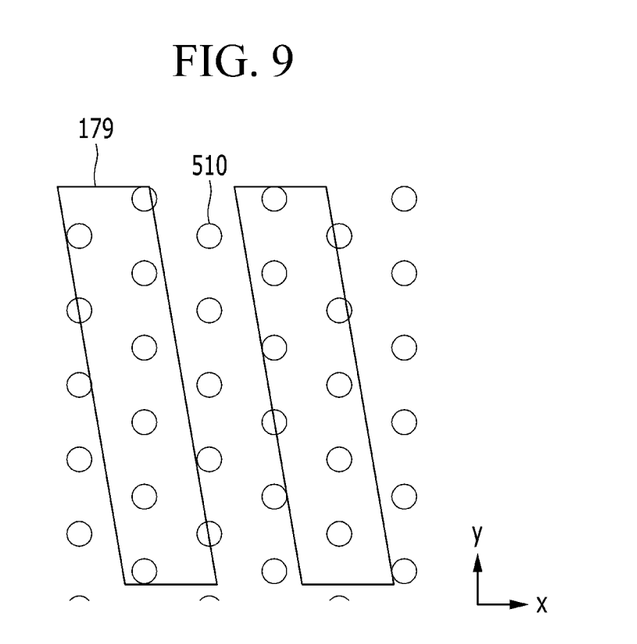
FIG. 9 is a top plan view of a conductive particle and a data pad of the anisotropic conductive film of the display device according to an embodiment.
Figure 10:
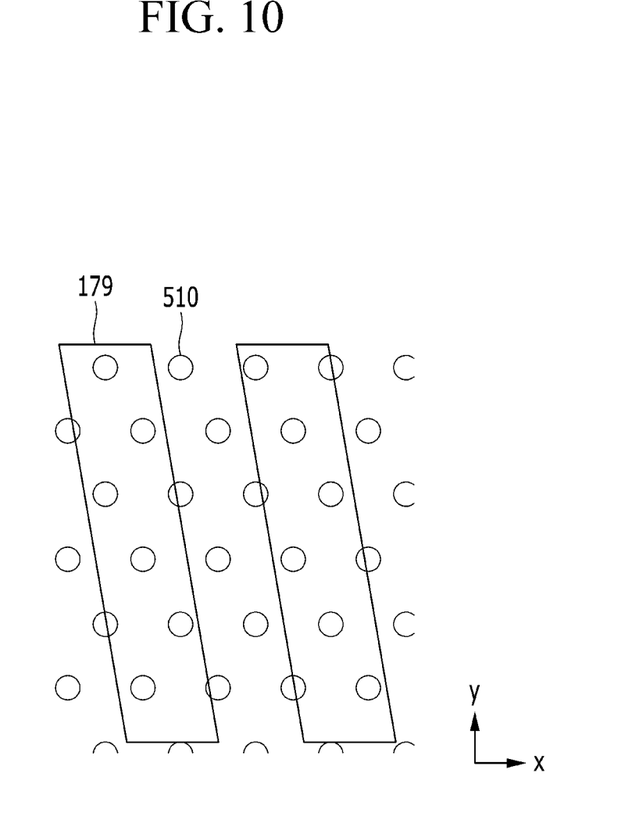
FIG. 10 is a top plan view of a conductive particle and a data pad of the anisotropic conductive film according to Reference Example 2.

FIG. 6 is a top plan view of an anisotropic conductive film according to Reference Example 1. FIG. 7 is a top plan view of the anisotropic conductive film of the display device according to an embodiment, and FIG. 8 is a top plan view of an anisotropic conductive film according to Reference Example 2. FIG. 9 is a top plan view illustrating the conductive particles and the data pads of the display device according to an embodiment, and FIG. 10 is a top plan view of conductive particles and data pads of Reference Example 2.

As shown in FIG. 6, an anisotropic conductive film 500 according to Reference Example 1 includes a plurality of conductive particles 510 arranged with a constant gap along the x-axis direction and a plurality of conductive particles 510 arranged with a constant gap along the y-axis. In Reference Example 1, the plurality of conductive particles 510 are respectively disposed at apexes of a virtual square. In Reference Example 1, the plurality of conductive particles 510 that are adjacent to each other in the x-axis direction respectively have a constant gap, and the plurality of conductive particles 510 that are adjacent to the y-axis direction respective have a constant gap. However, gaps between the conductive particles 510 that are adjacent to each other along a diagonal direction of the virtual square are greater than the gaps of the conductive particles 510 that are adjacent to each other in the x-axis direction or the y-axis direction.

When the gaps between the conductive particles 510 are narrow, a short-circuit may occur between the conductive particles 510. When the conductive particles 510 have wide gaps, the pad portions of the wire substrate and the output electrodes of the printed circuit board may be partially electrically disconnected. Thus, in order to establish proper electric connection between the pad portions and the output electrodes while preventing a short-circuit therebetween, it is most ideal to set a constant gap between the plurality of conductive particles 510. In the anisotropic conductive film of the display device according to an embodiment, the plurality of conductive particles 510 are disposed at respective apexes of a virtual square, and accordingly the plurality of conductive particles 510 have a constant gap, thereby preventing occurrence of a short-circuit or electrical disconnection.

As shown in FIG. 7, the plurality of conductive particles 510 of the anisotropic conductive film of the display device according to an embodiment are disposed at the respective apexes of every virtual square, and the longest diagonal of each square is parallel with the y-axis. The plurality of conductive particles 510 are arranged in a matrix format, and for example, the plurality of conductive particles 510 may be arranged in an n-th row, an (n+1)-th row, and an (n+2)-row, respectively. When a distance between every adjacent conductive particles 510 is r, a distance between the n-th row and the (n+1)-th row is r/2, and a distance between the (n+1)-th row and the (n+2)-th row is r/2. That is, a distance between rows is r/2.

As shown in FIG. 8, in the anisotropic conductive film according to Reference Example 2, a plurality of conductive particles 510 are respectively disposed at respective apexes of every virtual square, and the longest diagonal of each virtual square is oblique to the y-axis. Instead, the shortest diagonal of each virtual square is parallel with the y-axis. The plurality of conductive particles 510 are arranged in a matrix format, and for example, the plurality of conductive particles 510 may be respectively arranged in an n-th row, an (n+1)-th row, and an (n+2)-th row. When a distance between every adjacent conductive particles 510 is r, a distance between the n-th and the (n+1)-th row is $(\sqrt{3}/2)r$ and a distance between the (n+1)-th row and the (n+2)-th row is $(\sqrt{3}/2)r$. That is, a distance between rows is $(\sqrt{3}/2)r$.

As shown in FIG. 9 and FIG. 10, the conductive particles 510 overlap the data pad 179, and electrical connection can be stably established when an overlapped area is wide. In FIG. 9, about nine conductive particles 510 overlap one data pad 179. In FIG. 10, about seven conductive particles 510 overlap one data pad 179. That is, it can be observed that the anisotropic conductive film of the display device according to an embodiment has higher reliability in electric connection than the anisotropic conductive film of Reference Example 2.

Since the display device according to an embodiment is a flexible display device, deformation may occur in the substrate and thus the shape of the pad portion extends along the y-axis direction. Thus, as the plurality of conductive particles 510 are disposed closer to the y-axis direction, that is, as a distance between rows is narrowed, reliability of electrical connection can be improved. In the anisotropic conductive film of the display device according to an embodiment, the plurality of conductive particles 510 are respectively disposed at the apexes of each of the virtual squares and the longest diagonal of the virtual square is parallel with the y-axis such that the distance between rows is minimized, thereby stably connecting the pad portions of the wire substrate and the output electrodes of the printed circuit board.

Next, a display area of the display device according to an embodiment will be described in detail with reference to FIG. 11.

Figure 11:
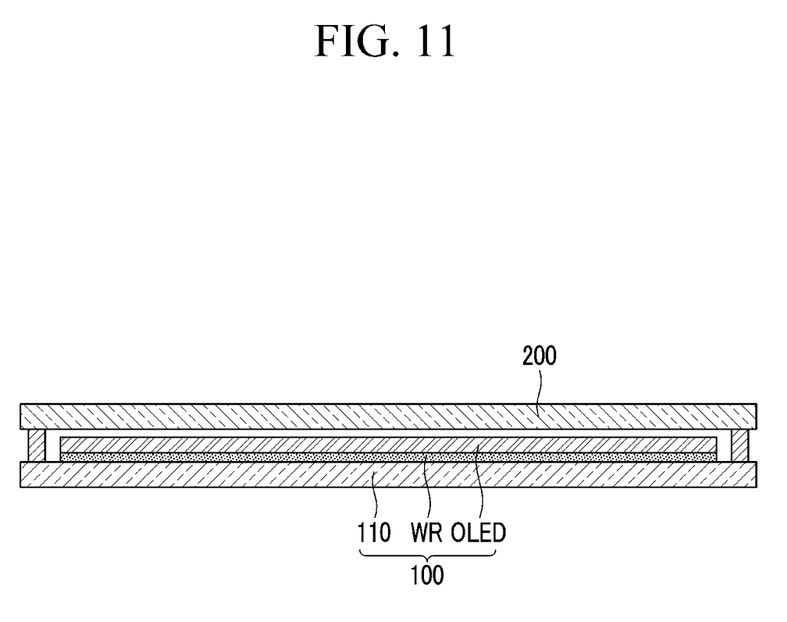
FIG. 11 is a cross-sectional view of the display device of FIG. 1, taken along the line XI-XI.

FIG. 11 is a cross-sectional view of the display device of FIG. 1, taken along the line XI-XI.

The wire substrate 100 includes a first substrate 110, a wire portion WR disposed on the first substrate 110, and an organic light emitting diode (OLED).

The first substrate 110 includes an insulating substrate, and includes a bendable or foldable material.

The wire portion WR and the organic light emitting diode OLED are disposed between the first substrate 110 and the encapsulation substrate 200. The wire portion WR and the organic light emitting diode OLED are protected by the encapsulation substrate 200 such that permeation of moisture can be prevented.

The wire portion WR includes a plurality of signal lines, a thin film transistor, and the like, and the signal lines are connected with pad portions disposed at a peripheral area of the wire substrate 100.

The organic light emitting diode OLED emits light according to a driving signal transmitted from the wire portion WR.

Figure 12:
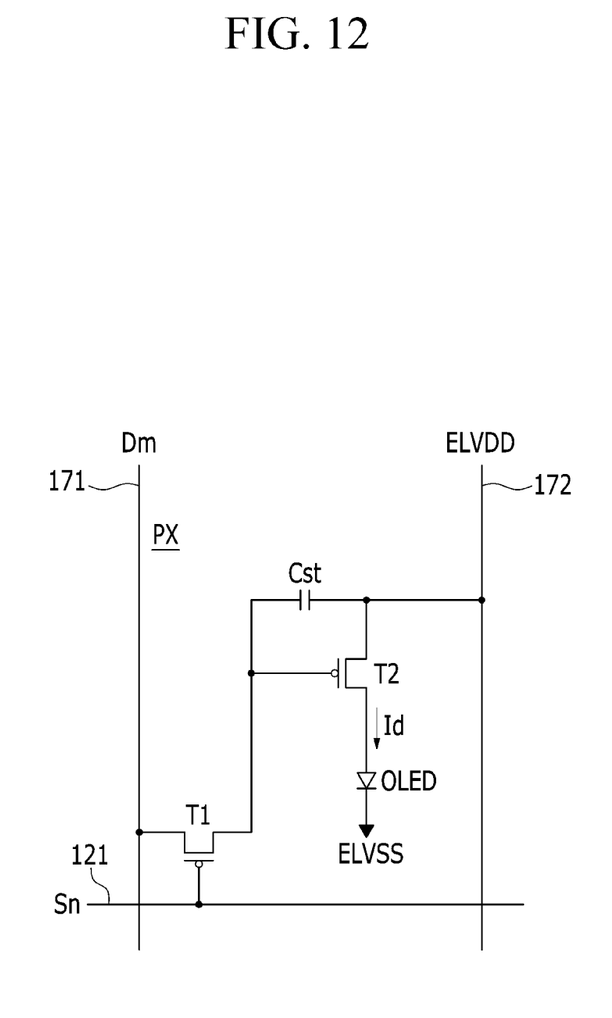
FIG. 12 is an equivalent circuit diagram of a pixel in a display area of the display device according to an embodiment.
Figure 13:
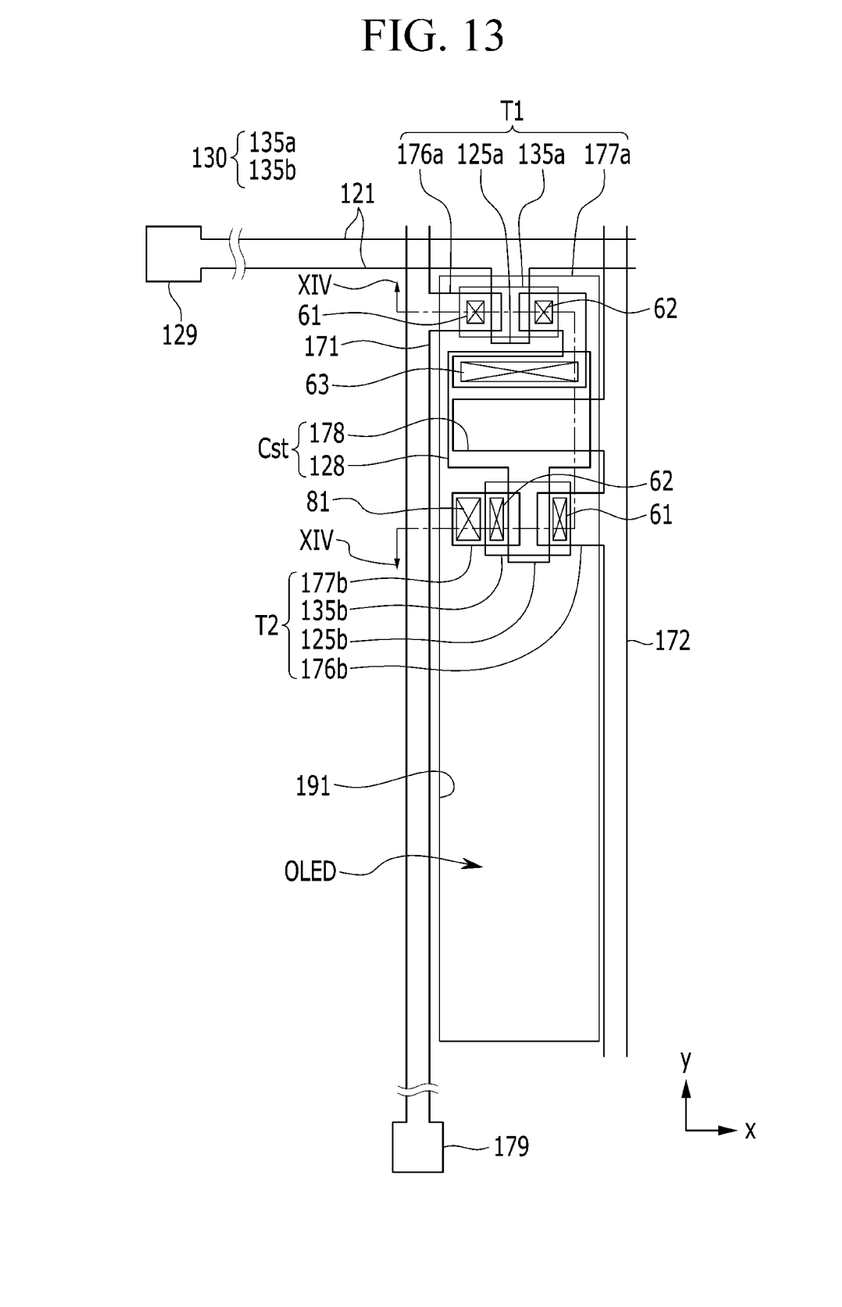
FIG. 13 is a top plan view of a pixel of the display device according to an embodiment.
Figure 14:
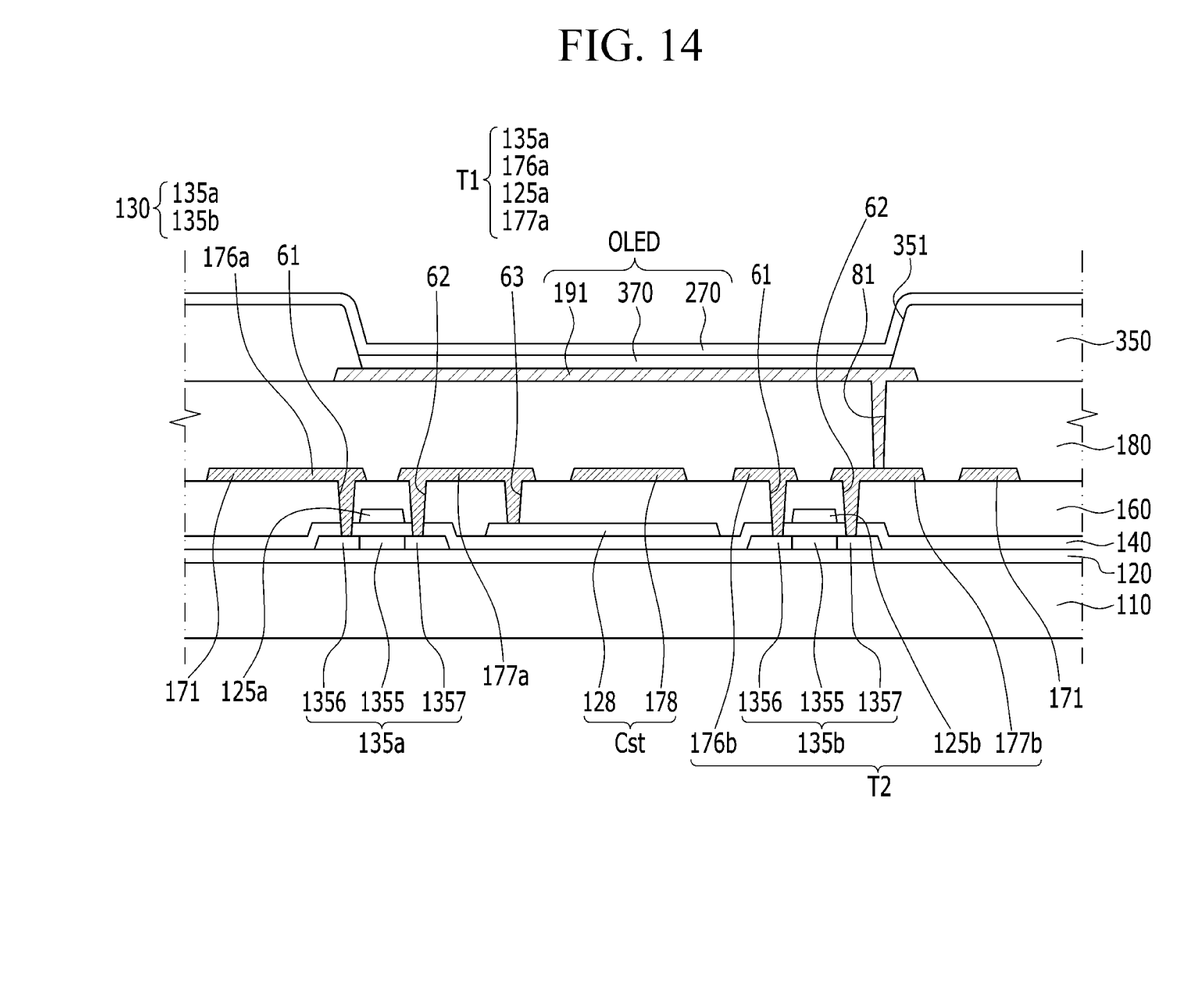
FIG. 14 is a cross-sectional view of the display of FIG. 13, taken along the line XIV-XIV.

FIG. 12 to FIG. 14 show detailed structures of the wire portion WR and the organic light emitting diode OLED, but embodiments are not limited thereto. The wire portion WR and the organic light emitting diode OLED may have various structures within a range that can be readily modified by a person skilled in the art.

Hereinafter, an internal structure of the wire substrate 100 will be described in detail with reference to FIG. 12 to FIG. 14.

FIG. 12 is an equivalent circuit of one pixel in the display area of the display device according to an embodiment, FIG. 13 is a top plan view of the pixel of the display device according to an embodiment, and FIG. 14 is a cross-sectional view of the display device of FIG. 13, taken along the line XIV-XIV.

As shown in FIG. 12, a pixel PX of the display device according to an embodiment includes a plurality of signal lines 121, 171, and 172, a plurality of transistors T1 and T2 connected to the plurality of signal lines 121, 171, and 172, a storage capacitor Cst, and an organic light emitting diode OLED.

The transistors T1 and T2 include a switching transistor T1 and a driving transistor T2.

The signal lines 121, 171, and 172 include a plurality of data lines 171 transmitting a gate signal (also referred to as a scan signal), the plurality of data lines 171 crossing the gate lines 121 and transmitting a data signal Dm, and a plurality of driving voltage lines 172 transmitting a driving voltage ELVDD and extending in a direction that is parallel with the data lines 171. In FIG. 12, one gate line 121, one data line 171, and one driving voltage line 172 are illustrated, but they are connected with one pixel, and substantially, a plurality of gate lines 121, a plurality of data lines 171, and a plurality of driving voltage lines 172 may be formed. The plurality of gate lines 121 may extend in directions that are parallel with each other. The plurality of data lines 171 and the plurality of driving voltage lines 172 may extend in directions that are parallel with each other.

The switching transistor T1 includes a control terminal, an input terminal, and an output terminal. The control terminal of the switching transistor T1 is connected to the gate line 121, the input terminal thereof is connected to the data line 171, and the output terminal thereof is connected to the driving transistor T2. The switching transistor T1 transmits a data signal Dm applied to the data line 171 to the driving transistor T2 in response to the gate signal Sn applied to the gate line 121.

The driving transistor T2 also includes a control terminal, an input terminal, and an output terminal. The control terminal of the driving transistor T2 is connected to the switching transistor T1, the input terminal thereof is connected to the driving voltage line 172, and the output terminal thereof is connected to the organic light emitting diode OLED. The driving transistor T2 flows a driving current Id of which intensity varies according to a voltage between the control terminal and the output terminal.

The storage capacitor Cst is connected between the control terminal and the input terminal of the driving transistor T2. The storage capacitor Cst charges a data signal applied to the control terminal of the driving transistor T2 and maintains the charge of the data signal after the switching transistor T1 is turned off.

The organic light emitting diode OLED includes an anode connected to the output terminal of the driving transistor T2 and a cathode connected to a common voltage ELVSS. The organic light emitting diode OLED displays an image by emitting light of which strength varies depending on a current of the driving transistor T2. An image is displayed by adjusting luminance of each pixel by controlling intensity of light emission of the organic light emitting diode OLED of each pixel.

The switching transistor T1 and the driving transistor T2 may be N-channel field effect transistors (FETs) or P-channel field effect transistors. In addition, the connection relationship between the transistors T1 and T2, the storage capacitor Cst, and the organic light emitting diode OLED may be variously modified rather than being limited to the above-stated relationship.

Next, a detailed structure of the pixel shown in FIG. 12 will be described with reference to FIG. 13 and FIG. 14.

As shown in FIG. 13 and FIG. 14, a buffer layer 120 is disposed on the first substrate 110 of the display device according to an embodiment.

Semiconductors 130 are disposed above the buffer layer 120. The semiconductors 130 include a switching semiconductor 135a and a driving semiconductor 135b provided at a distance from each other. The semiconductor 130 may include a polysilicon material or an oxide semiconductor material. When the semiconductor 130 is includes an oxide semiconductor material, an additional protection layer may be provided to protect the oxide semiconductor material that is weak to an external environment such as a high temperature and the like.

The switching semiconductor 135a and the driving semiconductor 135b respectively include channels 1355, and source regions 1356, and drain regions 1357 respectively provided at lateral sides of the channels 1355. The source regions 1356 and the drain regions 1357 of the switching semiconductors 135a and the driving semiconductors 135b are contact doping regions including an impurity such as a P-type impurity or an N-type impurity.

A gate insulating layer 140 is provided on the switching semiconductor 135a and the driving semiconductor 135b.

The gate lines 121, a switching gate electrode 125a, a driving gate electrode 125b, and a first storage capacitor plate 128 are provided on the gate insulating layer 140.

The gate line 121 extends along the x-axis and may transmit the gate signal Sn. The switching gate electrode 125a protrudes upward of the switching semiconductor 135a from the gate line 121. The driving gate electrode 125b protrudes upward of the driving semiconductor 135b from the first storage capacitor plate 128. The switching gate electrode 125a and the driving gate electrode 125b respectively overlap the channels 1355.

A gate pad 129 connected with an end of the gate line 121 is provided on the gate insulating layer 140. As previously described, the gate pad 129 is disposed in the peripheral area of the wire substrate. FIG. 13 illustrates a connection relationship between the gate pad 129 and the gate line 121, and the location and shape of the gate pad 129 may substantially be in accordance with the location and the shape shown in FIG. 3. However, the location and the shape of the gate pad 129 can be variously modified. Further, the location and the shape of the second output electrode 422 of the printed circuit board 400 (refer to FIG. 5) may be changed according to variation of the location and shape of the gate pad 129.

An interlayer insulating layer 160 is provided on the gate insulating layer 140, the gate line 121, the driving gate electrode 125b, and the first storage capacitor plate 128.

Contact holes 61 and 62 that expose at least a part of an upper surface of the semiconductor 130 are provided in the gate insulating layer 140 and the interlayer insulating layer 160. Specifically, the contact holes 61 and 62 expose the source region 1356 and the drain region 1357 of the semiconductor 130. In addition, a storage contact hole 63 that overlaps a part of the first storage capacitor plate 128 is provided in the interlayer insulating layer 160.

The data line 171, the driving voltage line 172, a switching source electrode 176a, a driving source electrode 176b, a second storage capacitor plate 178, a switching drain electrode 177a, and a driving drain electrode 177b are provided on the interlayer insulating layer 160.

The data line 171 transmits the data signal Dm, and extends in the y-axis while crossing the gate line 121. The driving voltage line 172 transmits a driving voltage ELVDD, and extends in a direction that is parallel with the data line 171 at a distance therefrom.

The switching source electrode 176a protrudes toward the switching semiconductor 135a from the data line 171, and the driving source electrode 176b protrudes toward the driving semiconductor 135b from the driving voltage line 172. The switching source electrode 176a and the driving source electrode 176b are respectively connected with the source regions 1356a through the contact holes 61.

The switching drain electrode 177a faces the switching source electrode 176a and the driving drain electrode 177b faces the driving source electrode 176b, and the switching drain electrode 177a and the driving drain electrode 177b are respectively connected with the drain regions 1357 through the contact holes 62.

The switching drain electrode 177a is extended and is electrically connected with the first storage capacitor plate 128 and the driving gate electrode 125b through the storage contact hole 63 provided in the interlayer insulating layer 160.

The second storage capacitor plate 178 protrudes from the driving voltage line 127 and overlaps the first storage capacitor plate 128. Thus, the first storage capacitor plate 128 and the second storage capacitor plate 178 form a storage capacitor Cst using the interlayer insulating layer 160 as a dielectric material.

The switching semiconductor 135a, the switching gate electrode 125a, the switching source electrode 176a, and the switching drain electrode 177a form the switching transistor T1, and the driving semiconductor 135b, the driving gate electrode 125b, the driving source electrode 176b, and the driving drain electrode 177b form the driving transistor T2.

A data pad 179 connected with an end of the data line 171 is provided on the interlayer insulating layer 160. As previously described, the data pad 179 is disposed in the peripheral area of the wire substrate. FIG. 13 illustrates a connection relationship between the data pad 179 and the data line 171, and a substantial location and a substantial shape of the data pad 179 may accord with those illustrated in FIG. 3. However, the location and the shape of the data pad 179 may be various modified. In addition, a location and a shape of the first output electrode 421 of the printed circuit board 400 (refer to FIG. 5) may be modified depending on the variation of the location and the shape of the data pad 179.

A passivation layer 180 is provided on the data line 171, the driving voltage line 172, the switching source electrode 176a, the driving source electrode 176b, the second storage capacitor plate 178, the switching drain electrode 177a, and the driving drain electrode 177b. A contact hole 81 that exposes at least a part of the driving drain electrode 177b is provided in the passivation layer 180.

A pixel electrode 191 is provided on the passivation layer 180. The pixel electrode 191 may include a transparent conductive material such as indium tin oxide (ITO), indium zinc oxide (IZO), zinc oxide (ZnO), indium oxide ($In_2O_3$), or the like, or a reflective conductive material such as lithium (Li), calcium (Ca), lithium fluoride/calcium (LiF/Ca), lithium fluoride/aluminum (LiF/Al), aluminum (Al), silver (Ag), magnesium (Mg), gold (Au), or the like. The pixel electrode 191 is electrically connected with the driving drain electrode 177b of the driving transistor T2 through the contact hole 81, and becomes an anode of the organic light emitting diode OLED.

A pixel definition layer 350 is provided on the passivation layer 180. The pixel definition layer 350 includes a pixel opening 351 that overlaps the pixel electrode 191. The pixel definition layer 350 may be formed by including a resin such as polyacrylics or polyimides and a silica-based inorganic material.

An organic emission layer 370 is provided in the pixel opening 351 of the pixel definition layer 350. The organic emission layer 370 may be formed of a plurality of layers including at least one of an emission layer, a hole injection layer (HIL), a hole transport layer (HTL), an electron transport layer (ETL), and an electron injection layer (EIL). When the organic emission layer 370 includes all of them, the hole injecting layer may be provided on the pixel electrode 191, which is an anode, and the hole transporting layer, the emission layer, the electron transporting layer, and the electron injecting layer may be sequentially layered thereon.

The organic emission layer 370 may be a red organic emission layer emitting light of red, a blue organic emission layer emitting light of blue, or a green organic emission layer emitting light of green, and the red organic emission layer, the blue organic emission layer, and the green organic emission layer are respectively formed in a red pixel, a green pixel, and a blue pixel to realize a color image.

Optionally, in the organic emission layer 370, all of the red green and blue organic emission layers may be laminated together on the red pixel, the green pixel, and the blue pixel, and a red color filter, a green color filter, and a blue color filter are formed for each pixel, thereby implementing the color image. As another example, as the organic emission layer 370, white organic emission layers emitting white light are formed in all of the red pixel, the green pixel, and the blue pixel, and a red color filter, a green color filter, and a blue color filter are formed for respective pixels, thereby implementing the color image. In the case of implementing the color image by using the white organic emission layer and the color filters, it is not required to use a deposition mask for depositing the red organic emission layer, the green organic emission layer, and the blue organic emission layer on respective pixels, that is, the red pixel, the green pixel, and the blue pixel.

The white organic emission layer described in another example may be formed by one organic emission layer, and also includes a configuration formed so as to emit white light by laminating a plurality of organic emission layers. For example, a configuration which may emit white light by combining at least one yellow organic emission layer and at least one blue light emitting layer, a configuration which may emit white light by combining at least one cyan organic emission layer and at least one red light emitting layer, a configuration which may emit white light by combining at least one magenta organic emission layer and at least one green light emitting layer, or the like, may be included.

A common electrode 270 may be provided on the pixel definition layer 350 and the organic emission layer 370. The common electrode 270 may include a transparent conductive material such as indium tin oxide (ITO), indium zinc oxide (IZO), zinc oxide (ZnO), indium oxide ($In_2O_3$), or the like, or a reflective conductive material such as lithium (Li), calcium (Ca), lithium fluoride/calcium (LiF/Ca), lithium fluoride/aluminum (LiF/Al), aluminum (Al), silver (Ag), magnesium (Mg), gold (Au), or the like. The common electrode 270 becomes a cathode of the organic light emitting diode OLED. The pixel electrode 191, the organic emission layer 370, and the common electrode 270 form the organic light emitting diode OLED.

In the above-described embodiments, the display device is formed of an organic light emitting diode (OLED) display. However, the present invention is not limited thereto, and the display device according to other embodiments may be formed of a display device which is not an OLED display, such as, for example, the display device may be formed of a liquid crystal display.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 110: first substrate | 121: gate line |
| 129: gate pad | 171: data line |
| 179: data pad | 400: flexible printed circuit board |
| 410: input electrode | 421: first output electrode |
| 422: second output electrode | 500: anisotropic conductive film |
| 510: conductivity particle | |

What is claimed is:

1. A display device comprising:
   a first substrate;
   a wire portion disposed on the first substrate;
   a pad portion connected with the wire portion;
   a printed circuit board facing the first substrate and including an output electrode; and
   an anisotropic conductive film disposed between the first substrate and the printed circuit board,
   wherein the anisotropic conductive film comprises a plurality of conductive particles disposed with a constant gap, and the plurality of conductive particles respectively disposed at apexes of virtual regular hexagons in a plan view, with a longest diagonal of the respective virtual regular hexagon being parallel with the y-axis, and
   wherein the pad portion and the output electrode overlap each other and are electrically connected with each other through at least one of the plurality of conductive particles.

2. The display device of claim 1, wherein the pad portion comprises a data pad, and the data pad formed as a parallelogram of which the height is greater than the bottom side, the bottom side parallel with the x-axis perpendicular to the y-axis, and the height parallel with the y-axis.

3. The display device of claim 2, wherein the wire portion comprises a data line extending along the y-axis, and the data pad connected with an end of the data line.

4. The display device of claim 2, wherein the data pad is inclined obliquely with respect to the y-axis.

5. The display device of claim 4, wherein the pad portion comprises a plurality of data pads, the plurality of data pads inclined in two different directions.

6. The display device of claim 5, wherein the two directions are symmetrical to each other with respect to the y-axis.

7. The display device of claim 2, wherein the pad portion comprises a plurality of data pads,
   the plurality of data pads arranged in a matrix along the y-axis and the x-axis perpendicular to the y-axis, and
   a gap between the plurality of data pads adjacent to each other in the y-axis is greater than a gap between the plurality of data pads adjacent to each other in the x-axis.

8. The display device of claim 2, wherein the output electrode comprises a first output electrode electrically connected with the data pad, the first output electrode formed of a parallelogram of which the height is greater than the bottom side, the bottom side of the parallelogram parallel with the x-axis perpendicular to the y-axis, and the height of the parallelogram parallel with the y-axis.

9. The display device of claim 8, wherein the first output electrode is inclined obliquely with respect to the y-axis direction.

10. The display device of claim 9, wherein the output electrode comprises a plurality of first output electrodes, the plurality of first output electrodes inclined in two different directions.

11. The display device of claim 10, wherein the two directions are symmetrical to each other with respect to the y-axis.

12. The display device of claim 1, wherein the pad portion and the output electrode have the same shape in a plan view.

13. The display device of claim 1, wherein the printed circuit board is formed as a rectangle of which two sides are parallel with the y-axis, and two sides are parallel with the x-axis perpendicular to the y-axis.

14. The display device of claim 13, wherein the printed circuit board is disposed at one edge of the first substrate.

15. The display device of claim 14, wherein the first substrate is formed of a rectangle of which two sides are parallel with the y-axis, and two sides are parallel with the x-axis perpendicular to the y-axis.

16. The display device of claim 1, wherein the pad portion comprises a gate pad, the wire portion comprises a gate line extending in the x-axis perpendicular to the y-axis, the gate pad connected with an end of the gate line.

17. The display device of claim 16, wherein the output electrode comprises a second output electrode electrically connected with the gate pad.

18. The display device of claim 1, wherein the printed circuit board further comprises an input electrode receiving an external signal.

19. The display device of claim 1, wherein the display device comprises a flexible display device.

* * * * *